(12) United States Patent
Kajihara et al.

(10) Patent No.: US 9,322,094 B2
(45) Date of Patent: Apr. 26, 2016

(54) FILM-FORMING APPARATUS

(71) Applicant: CANON ANELVA CORPORATION, Kawasaki-shi (JP)

(72) Inventors: Yuji Kajihara, Fuchu (JP); Yasushi Yasumatsu, Inagi (JP); Kazuya Konaga, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 14/069,897

(22) Filed: Nov. 1, 2013

(65) Prior Publication Data
US 2014/0054167 A1 Feb. 27, 2014

Related U.S. Application Data

(63) Continuation of application No. PCT/JP2012/003527, filed on May 30, 2012.

(30) Foreign Application Priority Data

Jun. 30, 2011 (JP) ................................ 2011-145152

(51) Int. Cl.
*C23C 14/00* (2006.01)
*C23C 14/34* (2006.01)
(Continued)

(52) U.S. Cl.
CPC ............. *C23C 14/3464* (2013.01); *C23C 14/04* (2013.01); *C23C 14/3407* (2013.01);
(Continued)

(58) Field of Classification Search
CPC .................................................... H01J 37/3447

USPC ............................ 204/192.13, 298.01, 192.1
See application file for complete search history.

(56) References Cited

U.S. PATENT DOCUMENTS 3,985,635 A 10/1976 Adam et al.
6,461,484 B2 10/2002 Yo et al.
(Continued)

FOREIGN PATENT DOCUMENTS

JP 49-114585 11/1974
JP 63-255368 A 10/1988
(Continued)

OTHER PUBLICATIONS

U.S. Appl. No. 14/107,110, filed Dec. 16, 2013, Yuji Kajihara.
(Continued)

*Primary Examiner* — Keith Hendricks
*Assistant Examiner* — Timon Wanga
(74) *Attorney, Agent, or Firm* — Fitzpatrick, Cella, Harper & Scinto

(57) ABSTRACT

The present invention provides a film forming apparatus configured such that the occurrence of contamination is reduced between targets. The film forming apparatus includes: a plurality of target electrodes respectively having attachment surfaces to which targets can be attached; a substrate holder for holding a substrate at a position opposing the plurality of target electrodes; a first shutter member rotatably provided between the plurality of target electrodes and the substrate holder and having a plurality of openings that can oppose the attachment surfaces; and a shield member disposed adjacent to the first shutter member and having a number of openings equal to the number of the target electrodes, wherein a gap between the first shutter member and the shield member widens toward an outer perimeter from a portion where adjacent target electrodes are closest.

16 Claims, 12 Drawing Sheets

(51) Int. Cl.
  *C23C 14/04* (2006.01)
  *C23C 14/50* (2006.01)
  *C23C 14/54* (2006.01)
  *C23C 14/56* (2006.01)
  *H01J 37/34* (2006.01)

(52) U.S. Cl.
  CPC ............... *C23C14/505* (2013.01); *C23C 14/54* (2013.01); *C23C 14/564* (2013.01); *H01J 37/3417* (2013.01); *H01J 37/3429* (2013.01); *H01J 37/3435* (2013.01); *H01J 37/3447* (2013.01)

(56) References Cited

U.S. PATENT DOCUMENTS

| | | | |
|---|---|---|---|
| 7,156,961 B2 | 1/2007 | Okatani et al. | |
| 8,118,981 B2 | 2/2012 | Tsunekawa | |
| 2002/0029959 A1 | 3/2002 | Yo et al. | |
| 2003/0079984 A1 | 5/2003 | Okatani et al. | |
| 2004/0262155 A1* | 12/2004 | Lombardi et al. | 204/298.01 |
| 2009/0139865 A1 | 6/2009 | Nomura et al. | |
| 2009/0166195 A1 | 7/2009 | Kobayashi et al. | |
| 2009/0211897 A1* | 8/2009 | Tsunekawa | 204/192.13 |
| 2010/0206715 A1 | 8/2010 | Hiromi et al. | |
| 2011/0223346 A1* | 9/2011 | Kitada et al. | 427/523 |
| 2012/0006675 A1* | 1/2012 | Yamamoto | 204/192.1 |
| 2014/0034489 A1 | 2/2014 | Kajihara et al. | |

FOREIGN PATENT DOCUMENTS

| | | |
|---|---|---|
| JP | 1-94454 U | 6/1989 |
| JP | 10-158830 A | 6/1998 |
| JP | 2002-88471 A | 3/2002 |
| JP | 2003-141719 A | 5/2003 |
| JP | 2009-155706 A | 7/2009 |
| JP | 2009-221595 A | 10/2009 |
| JP | 2010-209463 A | 9/2010 |
| JP | 2011-1597 A | 1/2011 |
| TW | 200831689 A | 8/2008 |
| TW | 201114932 A | 5/2011 |
| WO | 2010/038421 A1 | 4/2010 |

OTHER PUBLICATIONS

English translation of International Search Report issued in PCT/JP2012/003527 dated Jul. 3, 2012 (2 pages).
Chinese Office Action issued in corresponding application No. 201280031817.4, dated Dec. 31, 2014—19 pages with English translation.

* cited by examiner

F I G. 5
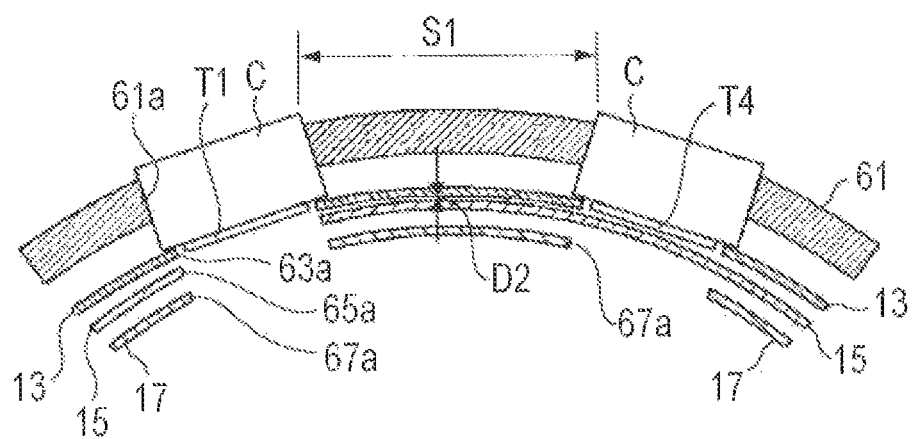

FIG. 10

| FILM FORMATION | TOP(63) | MID(65) | BTM(67) | OVERVIEW |
|---|---|---|---|---|
| T1 | T1,T2,T3—Mark, T4 FIXED | Mark 0° | Mark 0° | T1 |
| T2 | T1,T2,T3, T4 FIXED | 90° | 90° | T2 |
| T3 | T1,T2,T3, T4 FIXED | 0° | 180° | T3 |
| T4 | T1,T2,T3, T4 FIXED | 90° | 270° | T4 |
| T1-T3 Co-SP | T1,T2,T3, T4 FIXED | 0° | 90° | T1, T3 |
| T2-T4 Co-SP | T1,T2,T3, T4 FIXED | 90° | 0° | T2, T4 |

FILM-FORMING APPARATUS

This application is a continuation of International Patent Application No. PCT/JP2012/003527 filed on May 30, 2012, and claims priority to Japanese Patent Application No. 2011-145152 filed on Jun. 30, 2011, the entire content of both of which is incorporated herein by reference.

BACKGROUND OF THE INVENTION

1. Field of the Invention

The present invention relates to a film-forming apparatus, and specifically to a technique for reducing contamination in a multi-target sputter film-forming apparatus that includes a plurality of target electrodes made of different materials in a single chamber, for example, and that forms a multi-layered film by sputtering, using a rotary shutter apparatus.

2. Description of the Related Art

A multi-target sputter film-forming apparatus (for example, Japanese Patent Laid-open No. 2011-001597) can form a required multi-layered film in a single film-forming chamber by sputtering continuously without interruption from the bottom layer to the top layer on a substrate.

In order to form a multi-layered film by sputtering, in the film-forming apparatus of Japanese Patent Laid-Open No. 2011-001597, in a single chamber, a plurality of targets made of different materials are disposed on a ceiling portion of the chamber, or in other words, in a space above the substrate on which a film is to be formed, and a shutter apparatus for selecting a target to be used in sputter film formation is also provided. The shutter apparatus has a double shutter structure including shutter plates that rotate independently of each other. Each of the two shutter plates has a required number of openings formed in predetermined positions so that a selected target can be viewed from the substrate side.

With the rotary shutter apparatus, targets made of materials not to be used in film formation are shielded, and targets made of materials to be used in sputter film formation become visible from a substrate through the openings. The rotary shutter apparatus includes two shutter plates having a substantially circular shape as viewed from the substrate, and the two shutter plates are configured to rotate independently of each other. To select a target to be used in sputter film formation, each shutter plate is rotated by the rotary shutter apparatus such that a target made of a material that needs to be used in film formation faces the substrate through the opening.

In the case of sputter film formation in which a plurality of targets made of different materials to be used in film formation are selected in a specific order, if contamination occurs between the targets, the performance of the formed film may be low. There is a need for a technique for reliably preventing the occurrence of contamination in order to deposit a high-performance multi-layered film on a substrate.

Problems that the Invention is to Solve

However, contamination may occur due to sputtered particles passing through the gap between the cathode holder supporting cathodes and the rotary shutter place. As a countermeasure against this situation, it is preferable to make the gap between the cathode holder and the rotary shutter plate narrow. Meanwhile, in order to reduce the weight of the shutter apparatus, there are cases where the rotary shutter plate is made of a thin plate. In this case, the rotary shutter plate can be deformed due to the stress caused by a film on the rotary shutter plate, the blasting processing for cleaning the rotary shutter place, or the like, and therefore, it is necessary to form the gap between the cathode holder and the rotary shutter plate so as to provide a certain space therebetween.

A conventional shutter apparatus is shown in FIGS. 12, 13A and 13B. FIG. 12 is a top view of a rotary shatter apparatus, and FIGS. 13A and 13B are a cross-sectional view taken along the line A-A of FIG. 12 and a cross-sectional view taken along the line B-B of FIG. 12, respectively. In a conventional shutter apparatus 100, a gap D1 that allows a sputtered substance to pass therethrough is formed between a shield plate 103 on the cathode C side and a rotary shutter plate 103 on the cathode C side. In particular, as shown in FIG. 13B, the gap D1 between the shield plate 102 and the rotary shutter plate 103 is located in an area between adjacent cathodes. There is concern that contamination might occur due to the film-forming substance passing through the gap.

SUMMARY OF THE INVENTION

In view of the above problem, it is an object of the present invention to provide a film-forming apparatus configured such that the occurrence of contamination is reduced between targets.

A film-forming apparatus according to the present invention is a film-forming apparatus including; a plurality of target electrodes leaving an attachment surface to which a target can be attached; a substrate holder for holding a substrate at a position opposing the plurality of target electrodes; a first shutter-member rotatably provided between the plurality of target electrodes and the substrate holder and having a plurality of openings that can oppose the attachment surfaces; and a shield member disposed adjacent to the first shutter member and having a number of openings equal to the number of the target electrodes, wherein a gap between the first shutter member and the shield member widens toward their outer perimeters from a portion where adjacent target electrodes are closest.

The present invention can provide a film-forming apparatus that includes a plurality of targets in a single chamber so as to form a multi-layered file by sputtering and in which a target is selected with a rotary shutter apparatus, the film-forming apparatus being configured such that contamination is reduced between the targets.

Other features and advantages of the present invention will become apparent from the following description with reference to the accompanying drawings. Note that in the accompanying drawings, the same reference numerals are given to the same or similar components.

BRIEF DESCRIPTION OF THE DRAWINGS

The accompanying drawings are included in the specification, constitute a part of the specification, show embodiments of the present invention, and are used to illustrate the principle of the present invention together with the description in the specification.

FIG. 4B depicts a cross-sectional view taken along the line III-III of FIG. 3;

FIG. 5 depicts a cross-sectional view taken along the line II-II of FIG. 3;

FIG. 10 depicts a diagram illustrating operations of the shutter apparatus according to the second embodiment of the present invention;

DESCRIPTION OF THE EMBODIMENTS

Hereinafter, preferred embodiments of the present invention will be described with reference to the accompanying drawings. The members, arrangement and the like described below are merely examples embodying the invention and are not intended to limit the scope of the present invention, and thus various modifications can be made in accordance with the spirit of the present invention. The application of the film-forming apparatus according to the present invention is not limited to a sputtering apparatus, and the present invention is applicable to various PVD apparatuses in which a vapor deposition material can be selected with a shutter apparatus in a vacuum container.

First Embodiment

Figure 1:
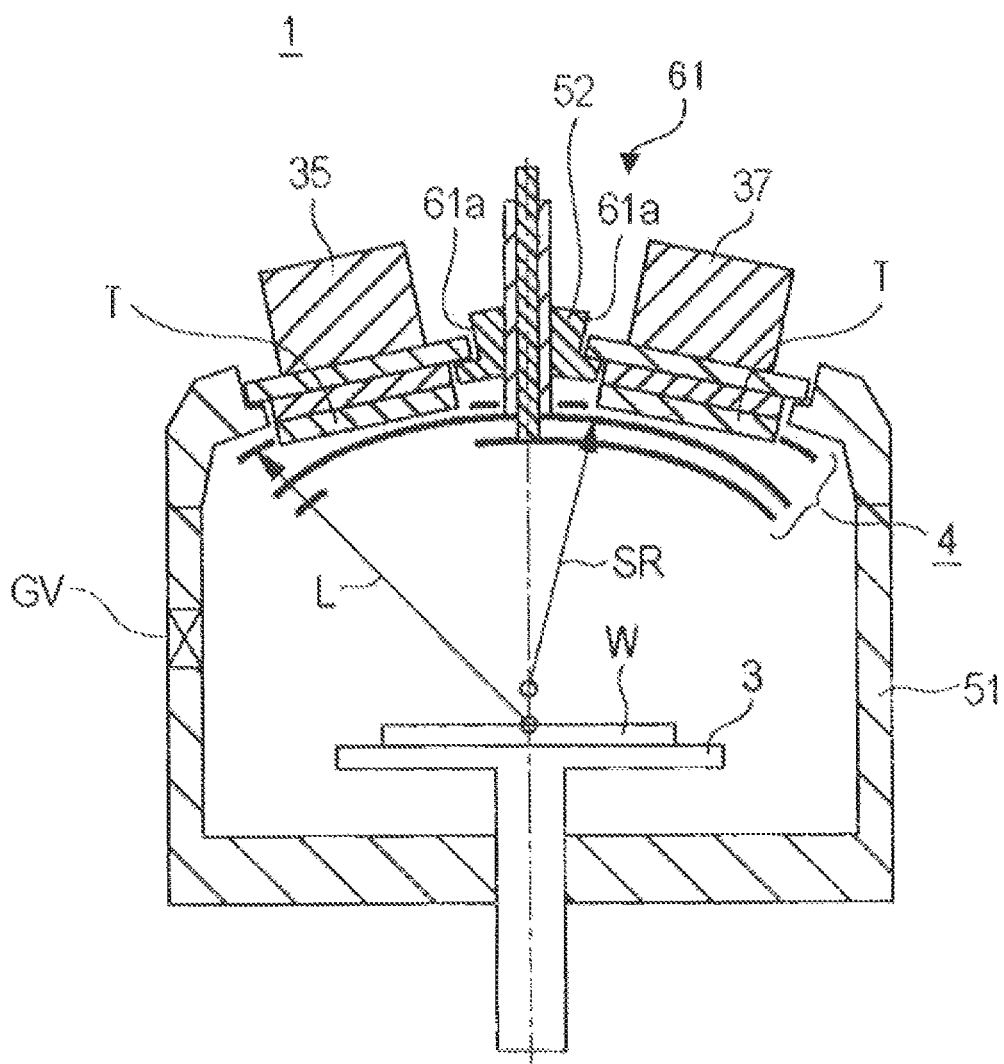
FIG. 1 depicts a vertical cross-sectional view of a film-forming apparatus according to a first embodiment of the present invention.

A film-forming apparatus according to a first embodiment of the present invention will be described with reference to FIGS. 1 to 5. FIG. 1 is a vertical cross-sectional view of a film-forming apparatus according to a first embodiment of the present invention. A film-forming apparatus 1 is a spatter film-forming apparatus including a vacuum container 51 internally provided with four target electrodes 35 to 38 (36 and 37 are not shown), a substrate holder 3 for holding a substrate W and a shutter apparatus 4 that can expose a given target T to the substrate W.

In FIG. 1, an evacuation unit for evacuating the inside of vine film-forming apparatus 1 into a required vacuum state, a unit for supplying power to the target electrodes 35 to 38, a substrate conveying apparatus for changing the substrate W on the substrate holder 3 via a gate valve GV, and a unit for generating plasma such as a process gas introducing unit are not illustrated.

The substrate holder 3 is rotatably provided at the center of a bottom portion of the film-forming apparatus 1, and is capable of holding the substrate W in a horizontal state. The substrate W is held in a rotating state while sputter film formation is performed on the substrate W. The four target electrodes 35 to 38 are attached to a ceiling portion 52 of the vacuum container 51 of the film-forming apparatus 1 at an inclination.

A target electrode holder 61 is provided on the ceiling portion 52 constituting an upper portion of the vacuum container 51. The target electrode holder 61 is a member having four attachment portions 61a for holding target electrodes. The target electrode holder 61 of the present embodiment also functions as a lid of the container 51, and is unitary with the ceiling portion 52. However, the attachment portions 61a may be provided to a portion of the vacuum container 51. The target electrodes held by the attachment portions 61a can each hold a target T to which given film-forming substance for film formation processing is bonded such that the target T faces in the direction of the substrate W. The portion of each target electrode where a target T is held is referred to as the target attachment surface.

FIG. 1 shows only two target electrodes located in a cross section. A target T can be disposed on each of the inclined target electrodes 35 to 38 such that the target T opposes the upper surface of the substrate W horizontally located below the target electrodes. A film-forming material to be used in film formation processing is bonded to the target T.

As used herein, the state in which the target T opposes the substrate encompasses a state in which the target electrode is oriented toward the periphery of the substrate, and a state as shown in FIG. 1 in which a sputter surface of the target T is inclined toward the substrate W. Examples of the multi-layered film device to be formed on the substrate include LEDs, MRAMs, TMR heads, advanced (improved) GMRs and the like. The type of targets mounted on the target electrodes of the film-forming apparatus 1 can of course be changed according to the film configuration of the multi-layered film device to be formed.

Between the target T and the substrate W is disposed the shutter apparatus 4. The shutter apparatus 4 includes two shutter plates (15 and 17). By the shutter apparatus 4 positioning each shutter plate (15 and 17) in position, one of the targets T respectively mounted on the four target electrodes 35 to 38 that is to be used in sputter film formation can be caused to face the substrate W.

Figure 2:
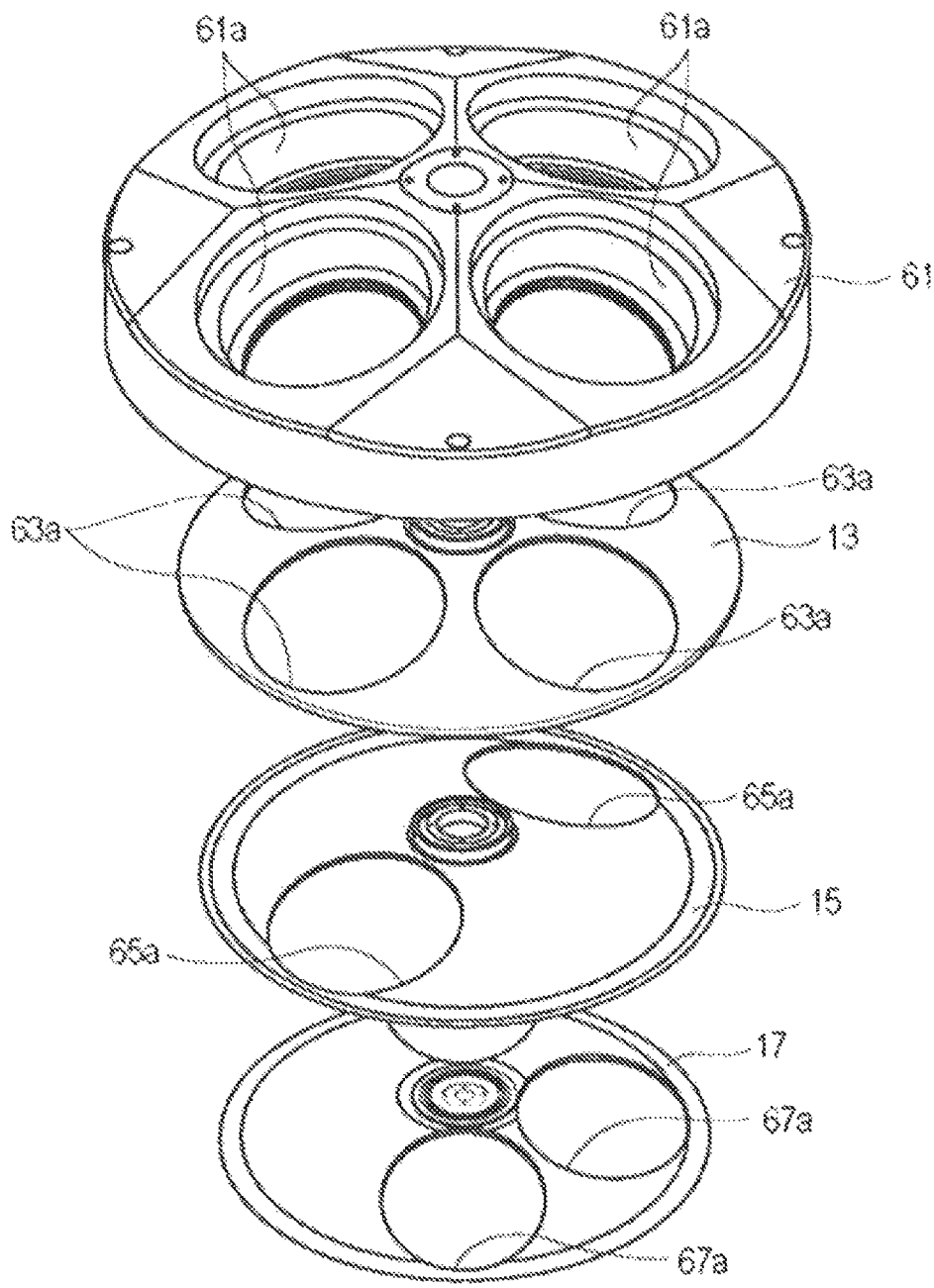
FIG. 2 depicts a perspective view showing members constituting a shutter apparatus according to the first embodiment of the present invention.
Figure 3:
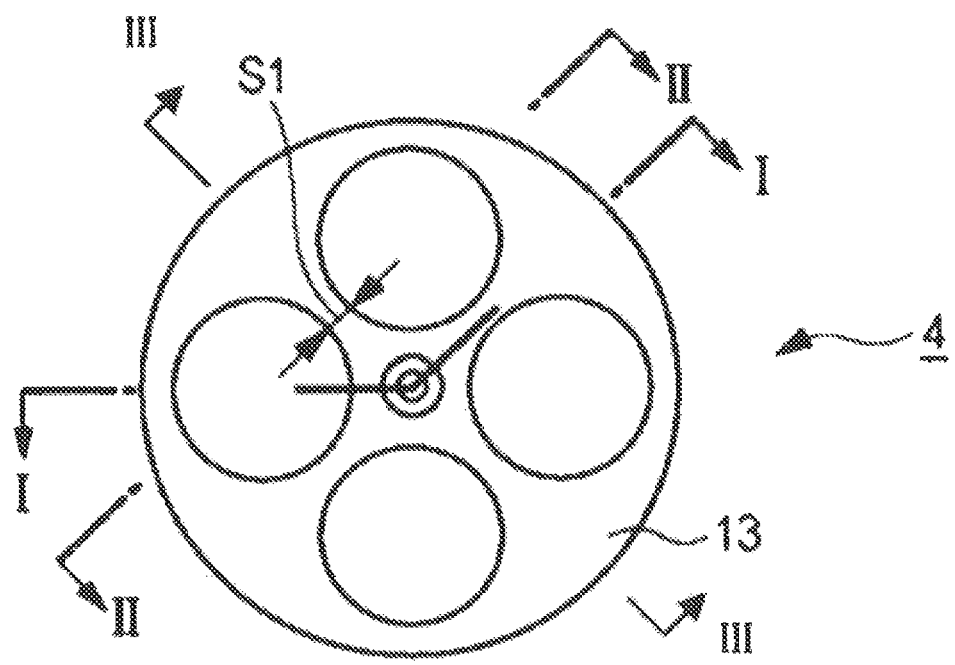
FIG. 3 depicts a schematic view of the shutter apparatus according to the first embodiment of the present invention, as viewed from above.
Figure 4A:
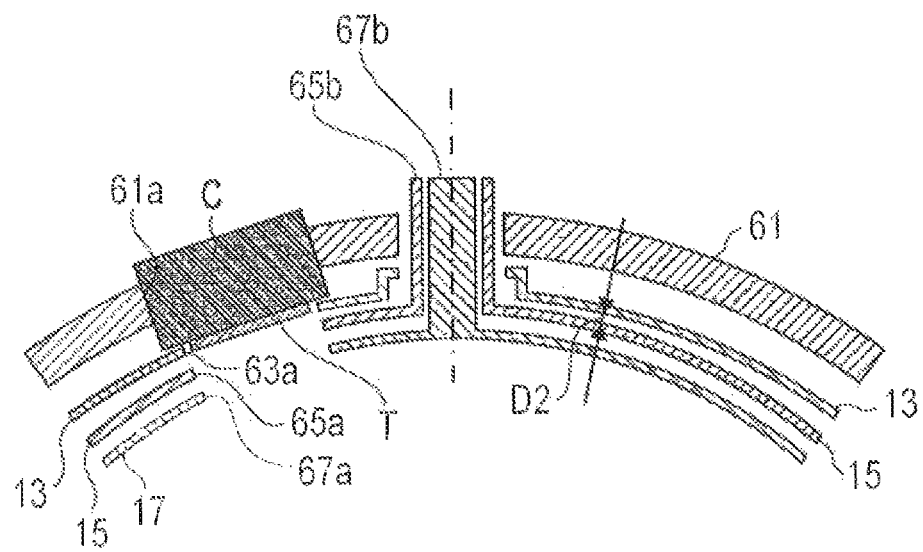
FIG. 4b depicts a cross-sectional view taken along the line I-I of FIG. 3.
Figure 4B:
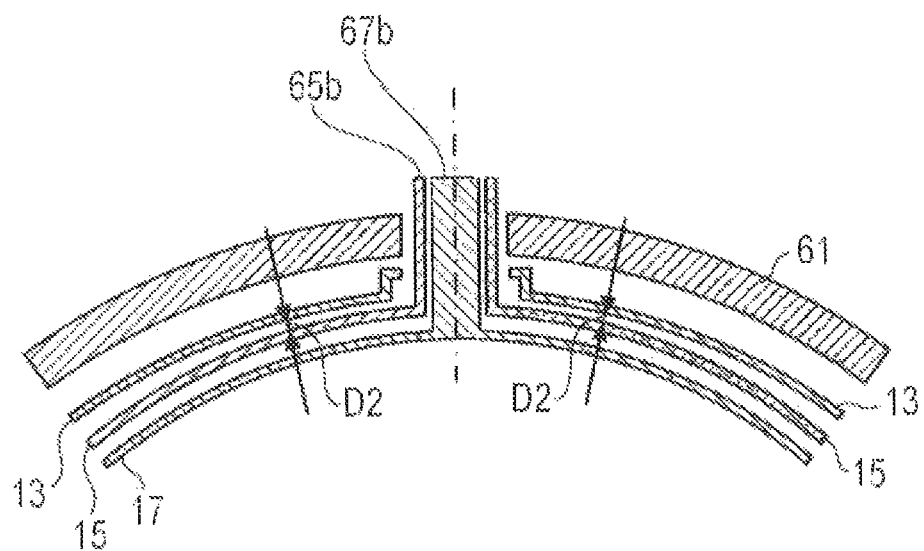

A structure of the shutter apparatus 54 will now be described with reference to FIGS. 2 to 6. FIG. 2 is a perspective view showing members constituting the shutter apparatus 54. FIG. 3 is a schematic view of the shutter apparatus 54 as viewed from above, showing only an upper shied plate. FIGS. 4A and 4B are a cross-sectional view taken along the line I-I of FIG. 3 and a cross-sectional view taken along the line III-III of FIG. 3, respectively. FIG. 5 is a cross-sectional view taken along the line II-II of FIG. 3. In FIGS. 4A, 4B and 5, a given target electrode selected from among the target electrodes 35 to 38 is indicated by reference character C, and a given target is indicated by reference character T (T1 to T4). The shutter apparatus 4 includes, as primary constituent components, an upper shield plate (shield member) 13, a first shutter plate (first shutter member) 15 and a second shutter plate (second shutter member) 17.

The upper shield plate 13 is a member that is attached to the target electrode holder 61 and that prevents adhesion of a film to the target electrode holder 51. In the case of a configuration in which the upper shield plate 13 is not disposed, the substrate-side surface of the target electrode holder 61 opposes the first shutter plate 15. The first shutter plate 15 and the second shutter plate 17 are configured as shutter plates of the double rotary shutter. All of the upper shield plate 13, the first shutter plate 15 and the second shutter plate 17 have upwardly bulged and curved shapes.

The upper shield plane (shield member) 13 is an adhesion preventing shield plate that is provided on the substrate holder 3 side of the target electrode holder 61 and can prevent the substances sputtered from the targets T from adhering to the target electrode holder 61. As described above, the target electrode holder 61 has four attachment portions 61a formed therein. Each of the attachment portions 61a holds a target electrode C. Each target electrode C has a surface to which a target T can be attached (attachment surface), and the upper shield plate 13 has openings 63a formed in areas respectively opposing the attachment surfaces of the target electrodes.

The first shutter plate (first shutter member) 15 is a shutter plate that is rotatably provided on the substrate holder 3 side of the upper shield plate 13, and the rotation angle of the first shutter plate 15 can be controlled by rotating a rotation shaft 65b. The first shutter plate 15 has openings 65a formed in areas that oppose the target attachment surfaces of two target electrodes. The two openings 65a of the first shutter plate 15 are formed in positions symmetric about the rotation shaft 65b.

The second shutter plate (second shutter member) 17 is a shutter plate that is rotatably provided on the substrate holder 3 side of the first shutter place 15, and the rotation angle of the second shutter plate 17 can be controlled by rotating a rotation shaft 67b. The rotation shaft 65b and the rotation shaft 67b are configured so as to be capable of being controlled to rotate independently of each other. The second shutter plate 17 has openings 67a formed in areas respectively opposing the target attachment surfaces of three target electrodes. Also, among the three openings 67a of the second shutter plate 17, two openings in positions symmetric about the rotation shaft 67b are formed such that they can be disposed so as to oppose the two openings 65a of the first shutter plate 15. Note that the number of openings 67a of the second shutter plate 17 is not limited to three.

A characteristic structure of the present embodiment will now be described with reference to FIGS. 4A, 4B and 5. FIG. 4a is a cross-sectional view taken alone the line I-I of FIG. 3, FIG. 5 is a cross-sectional view taken along the line II-II of FIG. 3, and FIG. 4B is a cross-sectional view taken along the line III-III of FIG. 3. In the double rotary shutter of the present embodiment, the upper shield plate 13 and the first shutter plate 15 have different curved shapes. In one example, the upper shield plate 13 and the first shutter plate 15 have curved shapes that each constitute on area of a spherical surface, and the radius SR of the spherical surface to which the outer surface shape of the first shutter place 15 belongs is set to be smaller than the radius L of the spherical surface to which the inner surface shape of the upper shield plate 13 belongs. Also, the center of the spherical surface to which the outer surface of the first shutter plate 15 belongs is located at a position farther away from the substrate holder 3 than the center of the spherical surface to which the inner surface of the upper shield plate 13 belongs (see FIG. 1). The degree of curvature of the first shutter plate 15 is greater than that of the upper shield plate 13. The second shutter plate 17 is configured to have a shape that allows the spacing between the second shutter plate 17 and the first shutter plate 15 to be the same at any position.

The upper shield plate 13 and the first shutter plate 15 are disposed, as shown in FIGS. 4A, 4B, and 5, such that a gap D2 between the upper shield plate 13 and the first shutter plate 15 in a portion S1 where adjacent targets T1 and T4 are closet is narrower than a gap located on the side of the outer perimeter.

Figure 14:
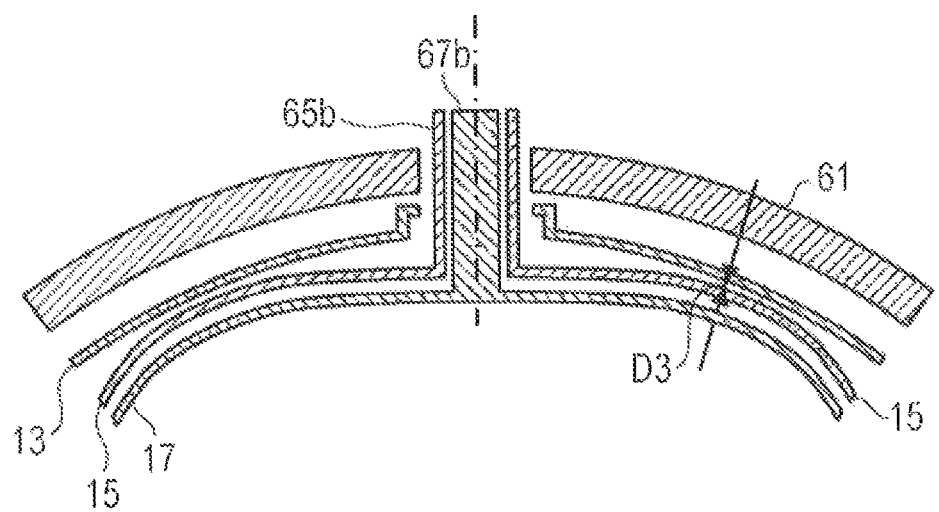
FIG. 14 depicts a cross-sectional view taken along the line III-III of FIG. 3, showing a variation of the first embodiment of the present invention.

In the shutter apparatus 4 of the present embodiment, in a planar state, the upper shield plate 13 and the first shutter plate 15 leave a diameter of 600 mm, and the gap D2 is approximately 3 mm. The gap between the upper shield plate 13 and the first shutter plate 15 gradually widens toward their outer perimeters from the portion S1 where adjacent target electrodes are closest. In the example shown in FIGS. 4A, 4B and 5, the cap between the upper shield plate 13 and the first shutter plate 12 gradually narrows inwardly (toward the rotation shaft 67b) from the portion S1 where adjacent target electrodes are closest. However, as shown in FIG. 14, the gap between the upper shield plate 13 and the first shutter plate 15 may gradually widen inwardly (toward the rotation shaft 67b) from the portion S1 where adjacent target electrodes are closest (hereinafter referred to as immediate vicinity portion S1). As used herein, the immediate vicinity portion S1 refers to an area that is located between adjacent targets (for example, T1 and T4) and where the distance between the adjacent targets is the shortest.

As described above, the gap D2 between the upper shield plate 13 and the first shutter plate 15 in the immediate vicinity portion S1 is made narrower than the gap on the side of the outer perimeter, whereby it is possible to prevent the occurrence of contamination between the targets T1 and T4 due to the film-forming substance passing through the gap D2. Contamination occurs as a result of a substance sputtered from a target adhering to the surface of a target that is different from the target from which the substance is sputtered. Particularly when targets made of different deposition substances are adjacently disposed, it is often the case that a part of the substance sputtered from one of the targets passes through the immediate vicinity portion S1 and adheres to the surface of the other target that is adjacent to that target, thereby causing contamination. However, with the configuration of the present embodiment in which the gap in the immediate vicinity portion S1 is made narrow, it is possible to reduce contamination. Also, even if the first shutter plate 15 is deformed due to the stress caused by thermal expansion of the first shutter plate 15 or by a film on the first shutter plate 15, or the blasting processing for cleaning the first shutter plate 15, the upper shield plate 13 and the first shutter plate 15 will not come into contact with each other, because a sufficient gap is provided at the outer perimeter portion where a large amount of deformation takes place.

Even with a configuration excluding the second shutter plate 17 from the shutter apparatus 4, it is also possible to reduce the occurrence of contamination between adjacent targets. This configuration will be described later as a third embodiment.

The present embodiment employs the configuration in which the spherical radius of the first shutter plate 15 is set to be smaller than that of the upper shield plate 13, but the same effects can also be obtained by changing the radius of curvature of the upper shield plate 13 or the first shutter plate 15 in the immediate vicinity portion S1. For example, a configuration is possible in which a first shutter plate 15 whose spherical radius is smaller than that of the upper shield plate 13 is bent such that only the gap an the portion opposing the immediate vicinity portion S1 is narrow. In this configuration, the cap between the upper shield plate 13 and the first shutter plate 15 is at its narrowest in the immediate vicinity portion S1 and gradually widens toward both the outer perimeter and inwardly from the immediate vicinity portion S1. The space of the portion where a substance that can cause contamination passes through is narrow, and therefore contamination can be reduced.

Second Embodiment

Figure 6:
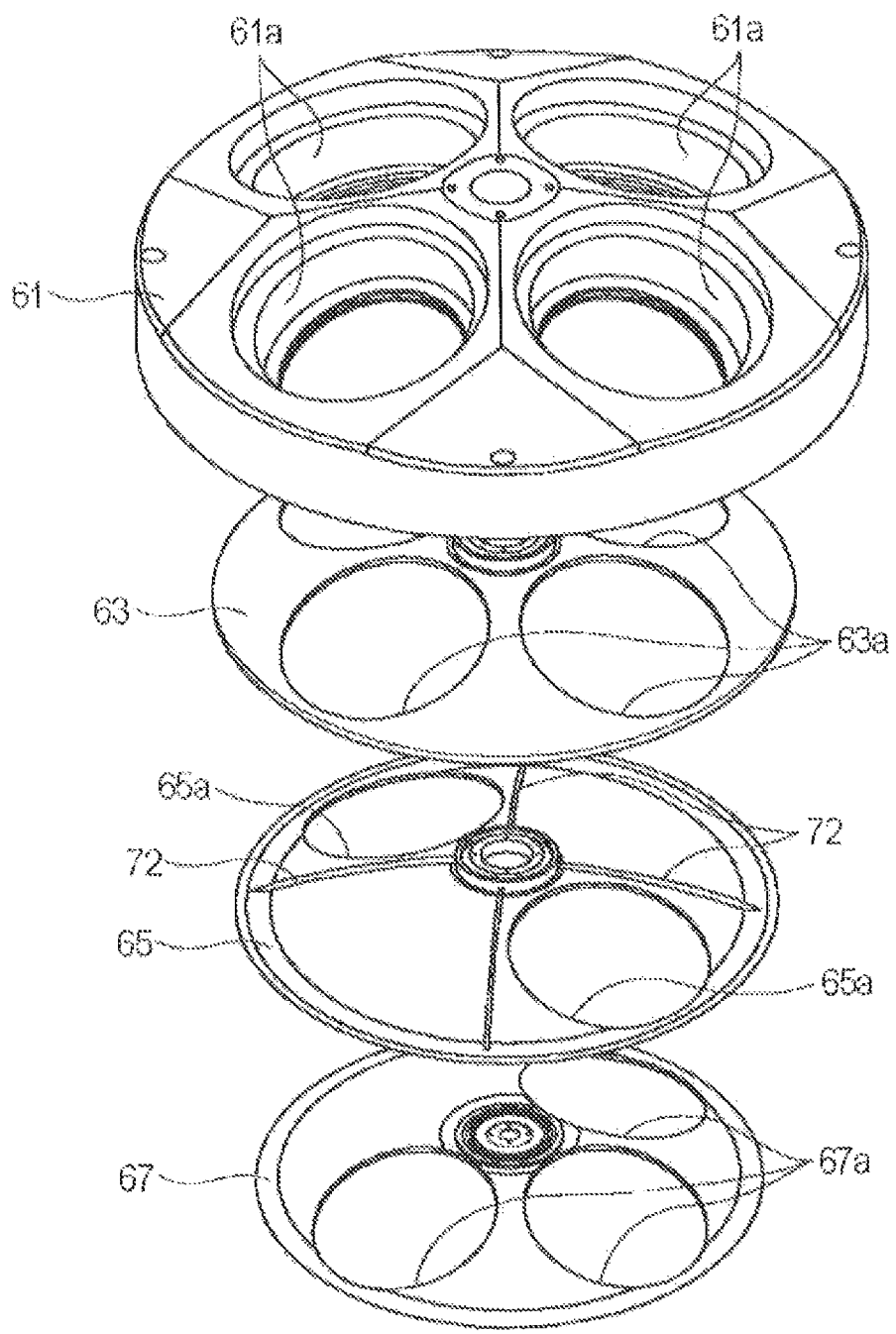
FIG. 6 depicts a perspective view showing members constituting a shutter apparatus according to a second embodiment of the present invention.
Figure 7:
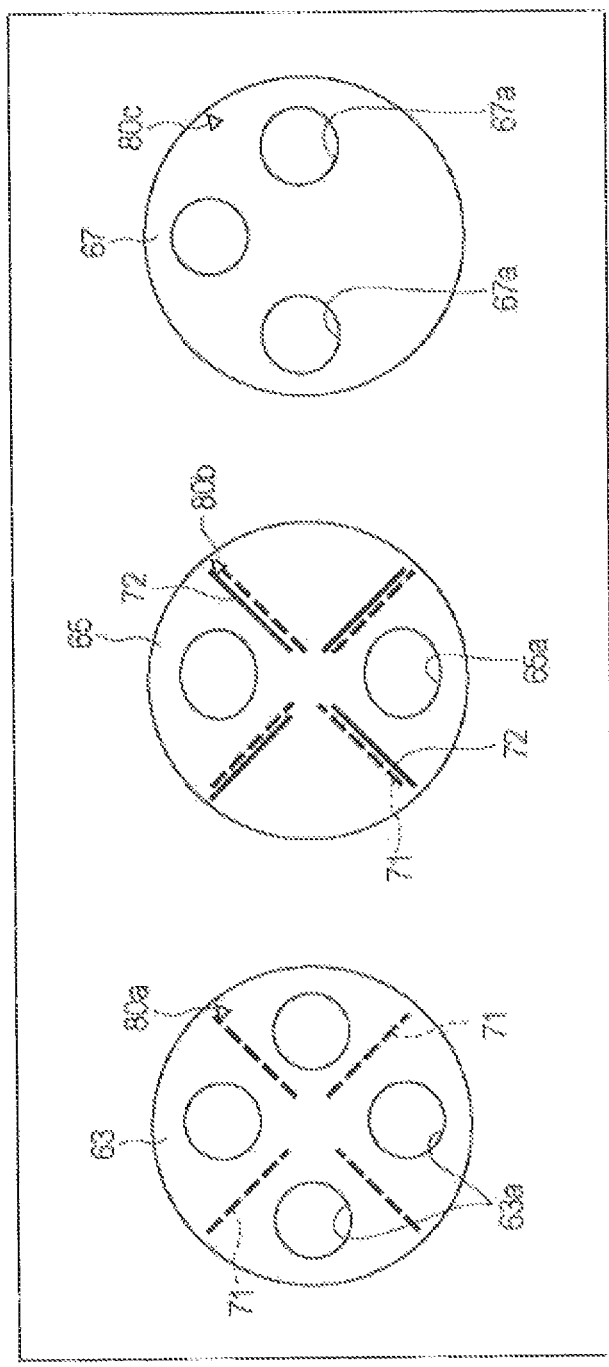
FIG. 7 depicts a diagram showing members constituting the shutter apparatus according to the second embodiment of the present invention, as viewed from above.
Figure 8:
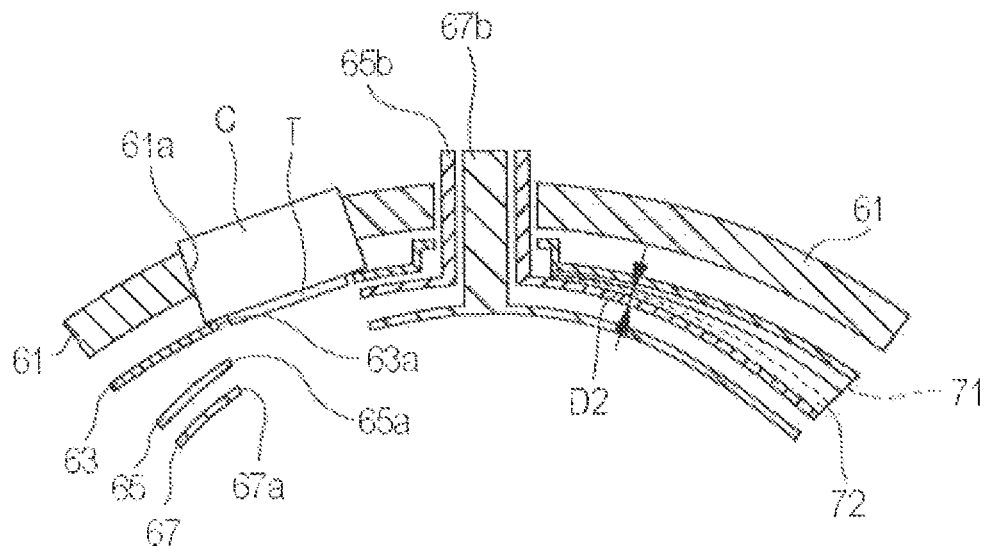
FIG. 8 depicts a cross-sectional view of the shutter apparatus according to the second embodiment of the present invention.
Figure 9:
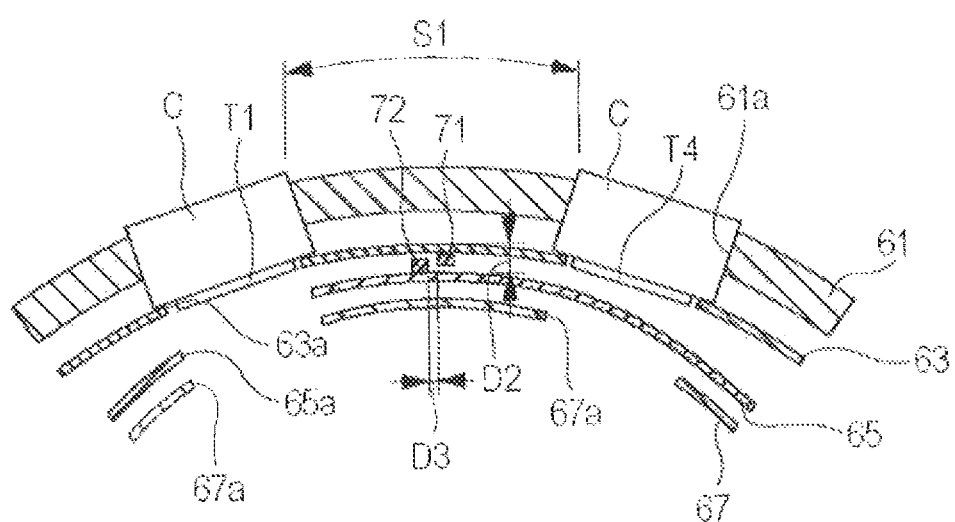
FIG. 9 depicts a cross-sectional view of the shutter apparatus according to the second embodiment of the present invention.

A film-forming apparatus according to a second embodiment of the present invention will be described with reference to FIGS. 6 to 9. FIG. 6 is a perspective view showing members constituting a shutter apparatus according to the present embodiment, FIG. 7 is a diagram showing members constituting the shutter apparatus according to the present embodiment, as viewed from above, and FIG. 3 shows only an upper shield plate. FIG. 8 is a cross-sectional view of the shutter apparatus of the present embodiment, which corresponds to FIG. 1, and FIG. 9 is a cross-sectional view of the shutter apparatus of the present embodiment, which corresponds to FIG. 5. In FIG. 8, a stationery separating wall 71 and a rotational separating wall 72 are also illustrated in order to clearly show the positional relationship between the stationery separating wall 71 and the rotational separating wall 72 as viewed from the side. Also, the same reference numerals are given to members, arrangements and the like that are the same as those of the first embodiment, and descriptions thereof are omitted here.

A main feature of a shutter apparatus 54 according to the present embodiment is that a stationery separating wall 71 (second separating wall) is provided on an upper shield plate (shield member) 63 and a rotational separating wall 72 (first separating wall) is provided on a first shutter plate (first shutter member) 65. In FIG. 7 showing the upper shield plate 63, the first shutter plate 65 and the second shutter plate 67 as viewed from above, in order to clearly show the positional relationship between the stationery separating walls 71 and the rotational separating walls 72 as viewed from above, the stationery separating walls 71, which actually cannot be seen from above, are indicated by broken lines.

The stationery separating wall 71 (second separating wall) is a plate-like member protruding toward the first shutter plate 65 from the upper shield plate (shield member) 63. Four stationery separating walls 71 in total are provided on both sides of four openings 63a in the upper shield plate 63. The four stationery separating walls 71 are attached radially from the center of the upper shield plate 63. In the present embodiment, the stationery separating walls 71 are attached to the upper shield plate 63, but the present invention can also be implemented with a configuration in which the upper shield plate 63 is not provided, and the stationery separating walls 71 are attached directly to the container 51 or the target electrode holder 61.

The rotational separating wall 72 (first separating wall) is a plate-like member protruding toward the upper shield plate 63 from the first shutter plate (first shutter member) 65. Four rotational separating walls 72 in total are provided on both sides of two openings 65a in the first shutter plate 65. The four rotational separating walls 72 are attached radially from the center of the first shutter plate 65. In FIG. 7, reference numerals 80a, 80b and 80c are marks indicating the reference position of the rotation angle of the first shutter plate 65 and the second shutter plate 67.

Between the two targets T are located a stationery separating wall 71 and a rotational separating wall 72. The stationery separating wall 71 and the rotational separating wall 72 have an overlapping area in the axial direction of the rotation shafts 65b and 67b (rotation shaft direction). Specifically, the sum of the height of the stationery separating wall 71 and the height of the rotational separating wall 72 is set to be longer than the length of the gap between the upper shield plate 63 and the first shutter plate 65. When the stationery separating wall 71 and the rotational separating wall 72 are viewed from the circumferential direction in FIG. 8, the stationery separating wall 71 is formed so as to extend radially from the rotation shaft 65b to an outer perimeter potation of the upper shield plate 63. The rotational separating wall 72 is also formed so as to extend radially from the rotation shaft 65b to an outer perimeter portion of the first shutter plate 65.

In other words, in a gap area between the upper shield plate 63 and the first shutter plate 65, an indirect path can be formed by the stationery separating wall 71 and the rotational, separating wall 72. This configuration can effectively prevent the atoms sputtered from one of the targets T from passing through the gap D2 between the upper shield plate 63 and the first shutter plate 65 and reaching the other target T.

In the present embodiment, the stationery separating wall 71 and the rotational separating wall 72 have an overlapping area in the axial direction of the rotation shafts 65b and 67b, and thus when the first shutter plate 65 is rotated by a predetermined angle or more about the rotation shaft 65b, the rotational separating wall 72 comes into contact with the stationery separating wall 71. That is, as shown in FIG. 9, all of the rotational separating walls 72 are provided such that they can be positioned close to one side in the circumferential direction of the stationery separating walls 71. During sputter film formation processing, the rotational separating walls 72 are positioned on one side in the circumferential direction of the stationery separating walls 71 so as to have a predetermined gap D3 with the stationery separating walls 71, thereby forming indirect paths between the rotational separating walls 72 and the stationery separating walls 71. The predetermined gap D3 can be smaller than gap D2.

In the rotary shutter apparatus 54 of the present embodiment, the rotational separating wall 72 can form an indirect path with the stationery separating wall 71, and thus contamination can be prevented more effectively than in the rotary shutter apparatus 4 of the first embodiment. It is also possible to effectively prevent contamination by making the gap D2 wider than that of the rotary shutter apparatus 4. Is this case, the degree of freedom in selecting the accuracy of machining or plate thicknesses at the rotary shutter plates at 65 and 67 can be increased.

The first shutter plate 65 can be rotated counterclockwise to almost 90° with respect to the paper plane of FIG. 7, with the positional relationship between the stationery separating walls 71 and the rotational separating walls 72 shown, in FIG. 7 as a reference. The first shutter plate 65 can be rotated to a position immediately before each rotational separating wall 72 contacts the other side of the next stationery separating wall 71 in the circumferential direction, and the angle to which the first shutter plate 65 can be rotated is, for example, 70 to 90° although the angle can vary slightly according to the thickness in the circumferential direction of the stationery separating walls 71 and the rotational separating walls 72.

In the present embodiment, the angle to which the first shutter plate 65 can be rotated (rotation angle) is set to 80°. Because the rotation angle is less than 90°, the openings 65a of the first shutter plate 65 can be formed to have a longer length in the circumferential direction than in the radial direction of the first shutter plate 65, so that the areas opposing the targets can be wide open. There as no limitation on the angle to which the second shutter plate 67 can be rotated.

The operations of the shutter apparatus 54 according to the present embodiment and advantageous effects thereof will be described with reference to FIG. 10. FIG. 10 schematically shows the target electrode holder 61, the first shutter plate 65 and the second shutter plate 67 as viewed from above in a table so as to show the rotational positions of the first shutter plate 65 and the second shutter plate 67 when a target or targets are used. The rightmost column of FIG. 10 schematically shows the shutter apparatus 54 as viewed from the substrate 34 side. In FIG. 10, the upper shield plate 63 is unitary with the target electrode holder 61, and the targets attached to the target electrodes 35 to 38 are respectively indicated by reference characters T1 to T4.

First, a description will be given of an operation of the shutter apparatus 54 when a film is formed on the substrate 34 by using only a target T1 from among the combinations showing the rotational positions of the first shutter plate 65 and the second shutter plate 67 in FIG. 10. The description will be given with reference to the row in which T1 is written in FIG. 10. Sputter film formation using the target T1 is performed by aligning an opening 65a of the first shutter plate 65 and an opening 67a of the second shutter plate 67 with respect to the target T1 and depositing a predetermined film on the surface of the rotating substrate 34. At this time, targets T2 and T4 are covered with the first shutter plate 65, and a target T3 is covered with the second shutter plate 67. This configuration can prevent the film-forming substance sputtered from the target T1 from adhering to the other targets T2, T3 and T4 from the substrate side.

Furthermore, at each position between the target T1 and the target T2 and between the target T1 and the target T3, the stationery separating wall 71 and the rotational separating wall 72 form an indirect path, thereby preventing the film-forming substance from the target T1 from moving in the gap between the upper shield plate 63 and the first shutter plate 65 as a result of which contamination can be prevented effectively. Also, the front surfaces of the targets T2 and T4 are covered with the first shutter plate 65, and thus it is possible to prevent the film-forming substance from moving from the target T1 to the target T2 and T4 through the gap between the first shutter plate 65 and the second shutter plate 67. The target T3 is not covered with the first shutter plate 65, but because of the fact that the target T3 is located farthest away from the target T1 and that the rotation shafts 65b and 67b are present between the targets T3 and T1, the film-forming substance from the target T1 can be prevented from reaching the target T3.

Next, an operation of the shutter apparatus 54 when a film is formed on the substrate 34 by using only the target T2 will be described (with reference to the row in which T2 is written in FIG. 10). In the case where sputter film formation is performed by using only the target T2, as compared with the case where only the target T1 is used, both the first shutter plate 65 and the second shutter plate 67 are rotated counterclockwise 80° with respect to the paper plane. Through this, an opening 65a of the first shutter plate 65 and an opening 67a of the second shutter plate 67 can be aligned with respect to the target T2. The targets T1 and T3 are covered with the first shutter plate 65, and the target T4 is covered with the second shutter plate 67. This configuration can prevent the film-forming substance sputtered from the target T2 from adhering to the other targets T1, T3 and T4 from the substrate side.

At each position between the target T2 and the target T3 and between the target T2 and target T4, the stationery separating wall 71 and the rotational separating wall 72 form an indirect path, thereby preventing the film-forming substance from the target T2 from moving in the gap between the upper shield plate 63 and the first shutter plate 65, as a result of which contamination on can be prevented effectively. Also, the front surfaces of the targets T1 and T3 are covered with the first shutter plate 65, and thus it is possible to prevent the film-forming substance from moving from the target T2 so the targets T1 and T3 through the gap between the first shutter plate 65 and the second shutter plate 67. Also, because the target T4 is located farthest away from the target T2, and the rotation shafts 65b and 67b are present between the targets T4 and T2, the film-forming substance from the target T2 can be prevented from reaching the target T4.

An operation of the shutter apparatus 54 when a film is formed on the substrate 34 by using only the target T3 will be described (with reference to the row in which T3 is written in FIG. 10). In the case where sputter film formation is performed by using only the target T3, as compared with the case where only the target T1 is used, the first shutter plate 65 is not rotated and the second shutter plate 67 is rotated 180° with respect to the paper plane. The targets T2 and T1 are covered with the first shutter plate 65, and the target T1 is covered with the second shutter plate 67. This configuration can prevent the film-forming substance sputtered from the target T3 from adhering to the other targets T1, T2 and T4 from the substrate side.

At each position between the target T3 and the targets T2 and T4 that are respectively adjacent to opposite sides of the target T3 in the circumferential direction, the stationery separating wall 71 and the rotational separating wall 72 form an indirect path, thereby preventing the film-forming substance from the target T3 from moving in the gap between the upper shield plate 63 and the first shutter plate 65, as a result of which contamination can be prevented effectively. Also, the front surfaces of the targets T2 and T4 are covered with the first shutter plate 65, and thus it is possible to prevent the film-forming substance from moving from the target T3 to the targets T2 and T4 through the gap between the first shutter plate 65 and the second shutter plate 67. Also, because the target T1 is located farthest away from the target T3, and the rotation shafts 65b and 67b are present between the targets T1 and T3, the film-forming substance from the target T3 can be prevented from reaching the target T1.

An operation of the shutter apparatus 54 when a film is formed on the substrate 34 by using only the target T1 will be described (with reference to the row in which T4 is written in FIG. 10). In the case where sputter film formation is performed by using only the target T4, as compared with the case where only the target T1 is used, the first shutter plate 65 is rotated counterclockwise 80° with respect to the paper plane, and the second shutter plate 67 is rotated counter clockwise 270° with respect to the paper plane. The targets T1 and T3 are covered with the first shutter plate 65, and the target T2 is covered with the second shutter plate 67. This configuration can prevent the film-forming substance sputtered from the target T4 from adhering to the other targets T1, T2 and T3 from the substrate side.

At each position between the target T4 and the targets T1 and T3 that are respectively adjacent to opposite sides of the target T4 in the circumferential direction, the stationery separating wall 71 and the rotational separating wall 72 form an indirect path, thereby preventing the film-forming substance from the target T4 from moving in the gap between the upper shield plate 63 and the first shutter plate 65, as a result of which contamination can be prevented effectively. Also, the front surfaces of the targets T1 and T3 are covered with the first shutter plate 65, and thus it is possible to prevent the film-forming substance from the target T4 from adhering to the targets T1 and T3 through the gap between the first shutter plate 65 and the second shutter plate 67. Also, because the target T2 is located farthest away from the target T4, and the rotation shafts 65b and 67b are present between the target T2 and T4, the film-forming substance from the target T4 can be prevented from reaching the target T2.

An operation of the shutter apparatus 54 when a film is formed on the substrate 34 by simultaneous sputtering (co-sputtering or simultaneous film formation processing) using both the targets T1 and T3 will be described (with reference to the row in which T1-T3 Co-SP is written in FIG. 10). In the case where co-sputtering using the targets T1 and T3 is performed, as compared with the case where only the target T1 is used, the first shutter plate 65 is not rotated and the second shutter plate 67 is rotated counterclockwise 90° with respect to the paper plane. At this time, the targets T1 and T3 are open with respect to the substrate 34, and the targets T2 and T4 are covered with the first shutter plate 65.

At each position on both sides in the circumferential direction of each of the targets T1 an T3, the stationery separating wall 71 and the rotational separating wall 72 form an indirect path, thereby preventing the film-forming substance from the targets T1 and T3 from moving in the gap between the upper shield plate 63 and the first shutter plate 65, as a result of which contamination can be prevented effectively. Also, the front surfaces of the targets T2 and T4 are covered with the first shutter plate 65, and thus it is possible so prevent the film-forming substance from moving from the targets T1 and T3 to the targets T2 and T4 through the gap between the first shutter plate 65 and the second shutter plate 67. In the co-sputtering using the targets T1 and T3, the two openings 65a of the first shutter plate 65 are symmetrically positioned with the rotation shaft 65b interposed therebetween, and thus the distance between the targets T1 and T3 is long, as a result of which cross contamination can be prevented effectively. Particularly when the film-forming substances of the targets T1 and T3 are different, cross contamination can be prevented effectively by the configuration or the present embodiment.

An operation of the shutter apparatus 54 when a film is formed on the substrate 34 by co-sputtering using both the targets T2 and T4 will be described (with reference to the row in which T2-T4 Co-SP is written in FIG. 10). In the case where co-sputtering using the targets T2 and T1 is performed, as compared with the case where only the target T1 is used, the first shutter plate 65 is rotated counterclockwise 80° with respect to the paper plane, and the second shutter plate 67 is not rotated. At this time, the targets T2 and T4 are open with respect to the substrate 34, and the targets T1 and T3 are covered with the first shutter plate 65.

At each position on both sides in the circumferential direction of each of the targets T2 and T4, the stationery separating wall 71 and the rotational separating wall 72 form an indirect path, thereby preventing the film-forming substance from the targets T2 and T4 from moving in the gap between the upper shield plate 63 and the first stutter plate 63, as a result of which contamination can be prevented effectively. Also, the targets T1 and T3 are covered with the first shutter plate 65, and thus it is possible to prevent the film-forming substance from moving from the targets T2 and T4 to the targets T1 and T3 through the gap between the first shutter plate 65 and the second shutter plate 67. In the co-sputtering using the targets T2 and T4, the two openings 65a of the first shutter plate 65 are symmetrically positioned with the rotation shaft 65b interposed therebetween, and thus the distance between the targets T2 and T1 is long, as a result of which cross contamination can be prevented effectively. Particularly when the film-forming substances of the targets T2 and T4 are different, cross contamination can be prevented effectively by the configuration of the present embodiment.

The above embodiment described a film-forming apparatus that can mount four targets (target electrodes) thereon, but the number of targets is not limited to four. For example, a configuration in which two targets (target electrodes) are mounted, the first shutter plate 65 has two openings 65a, and the second charter plate 67 has two openings 67a can also produce the same effect of preventing contamination as the above embodiment. In this case, a film-forming apparatus including only the targets T1 and T3 (or the targets T2 and T4) as shown in FIG. 10 is preferably used.

The advantageous effects of the film-forming apparatus of the present embodiment will be described. By providing a rotary shutter 54 as described above in a film-forming apparatus that includes a plurality of targets in at single chamber, forms a multi-layered film by sputtering, and selects a target by using the rotary shutter apparatus, contamination between targets can be prevented effectively. In particular, cross contamination during simultaneous sputter film formation can be prevented effectively. This enables a high-performance multi-layered film to be deposited on a substrate.

Third Embodiment

Figure 11:
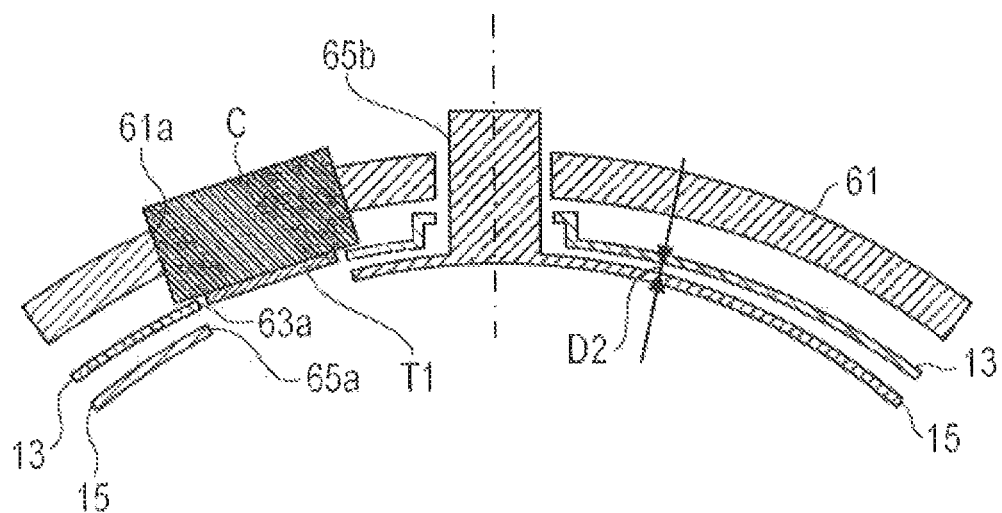
FIG. 11 depicts a cross-sectional view of a shutter apparatus according to a third embodiment of the present invention.
Figure 12:
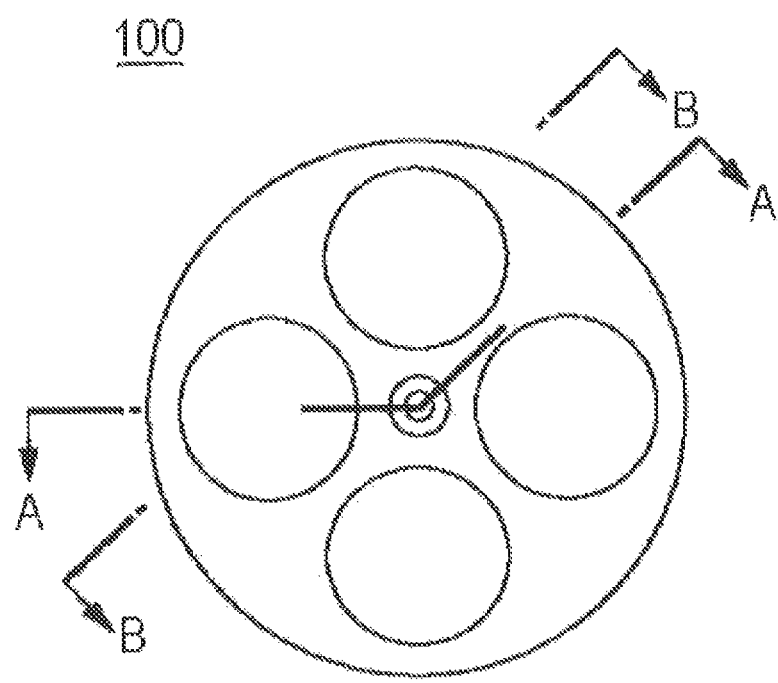
FIG. 12 depicts a schematic view of a conventional rotary shutter apparatus, as viewed from above.
Figure 13A:
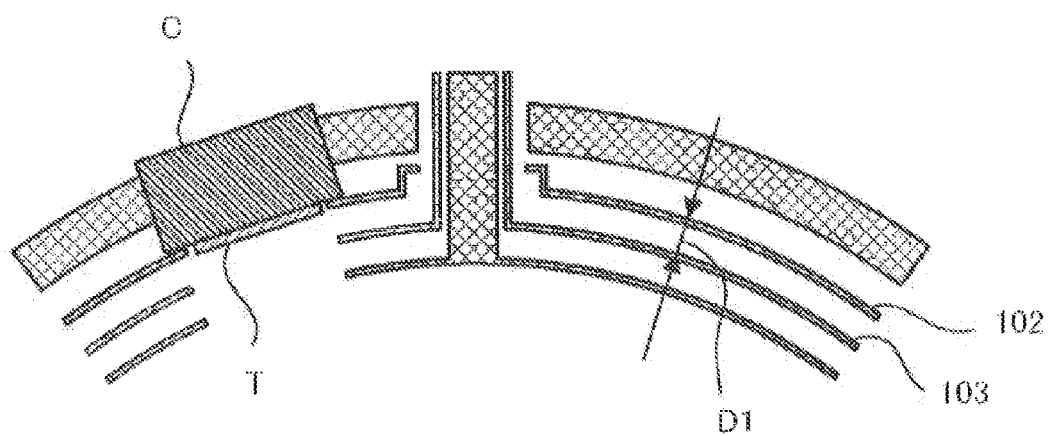
FIG. 13A depicts a cross-sectional view taken along the line A-A of FIG. 12.
Figure 13B:
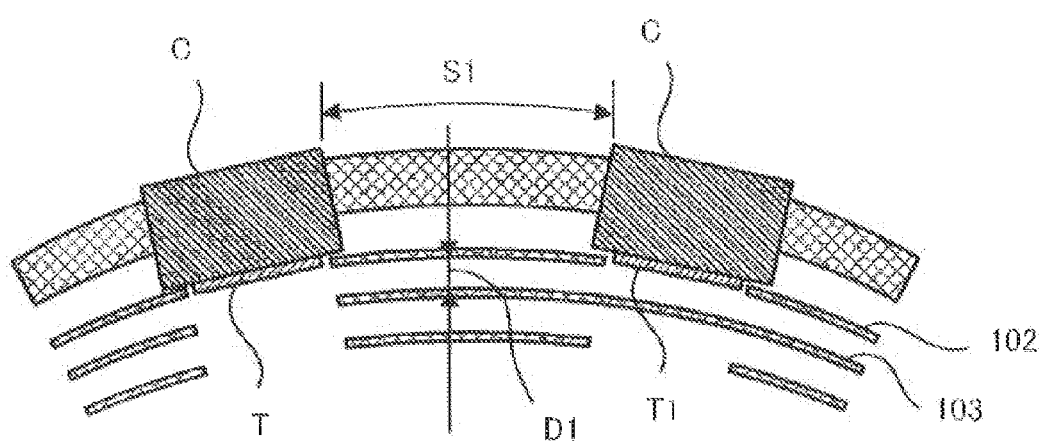
FIG. 13B depicts a cross-sectional view taken along the line B-B of FIG. 12.

A shutter apparatus according to the present embodiment is shown in FIG. 11 in cross section. The same reference numerals are given to members, arrangements and the like that are the same as those of the first embodiment, and descriptions thereof are omitted here. The shutter apparatus of the present embodiment is different from the shutter apparatuses 4 of the above embodiments in that the second shutter plate 17 is not provided. This is because in the configuration that does not include the second shutter plate 17, the gaps D2 on both sides in the circumferential direction of the targets T1 to T4 are made narrow, whereby movement of a film-forming substance in the gap D2 between the upper shield plate 13 and the first shutter plate 15 can be reduced. In other words, the occurrence of contamination between the targets can be prevented. Also, the same effects as those obtained in the second embodiment can be expected by providing the stationery separating wall 71 and the rotational separating wall 72 on the upper shield plate 13 and the first shutter plate 15 of the shutter apparatus of the present embodiment.

Fourth Embodiment

In each of the shutter apparatuses 54 described in the above embodiment, the upper shield plate 63 is disposed between the first shutter plate 65 and the target electrodes C, but with a configuration in which the upper shield plate 63 is disposed between the first shutter plate 65 and the second shutter plate 67, substantially the same advantageous effects can also be obtained. In this case, the rotational separating walls 72 are provided on the substrate holder 33-side surface of the first shutter plate 65, and the stationery separating walls 71 are provided on the first shutter member 65-side surface of the upper shield plate 63. Likewise, with a configuration in which the upper shield plate 63 is disposed on the substrate holder 33 side of the second shutter plate 67, and the rotational separating walls 72 are provided on the substrate holder 33-side surface of the second shutter plate 67, substantially the same advantageous effects can also be obtained.

The present invention is not limited to the above-described embodiments, and various changes and modifications can be made within the spirit and scope of the present invention. Therefore, to apprise the public of the scope of the present invention, the following claims are made.

DESCRIPTION OF THE REFERENCE NUMERALS

T, T1 to T4 Target
GV Gate Valve
W Substrate
1 Film-Forming Apparatus

3 Substrate Holder
4, 54 Shutter Apparatus
13, 63 Upper Shield Plate (Shield Member)
16, 65 First Shutter Plate (First Shutter Member)
17, 67 Second Shutter Plate (Second Shutter Member)
35 to 38, C Target Electrode
51 Container
52 Ceiling Portion
53 Magnet
61 Target Electrode Holder
63a, 65a, 67a Opening
65b, 67b Rotation Shaft
71 Stationery Separating Wall (Second Separating Wall)
72 Rotational Separating Wall (First Separating Wall)

What is claimed is:

1. A film forming apparatus comprising:
a plurality of target electrodes respectively having attachment surfaces to which targets can be attached;
a substrate holder for holding a substrate at a position opposing the plurality of target electrodes;
a first shutter member rotatably provided between the plurality of target electrodes and the substrate holder and having a plurality of openings that can oppose the attachment surfaces;
a shield member provided between the first shutter member and the plurality of target electrodes and having a number of openings equal to the number of the target electrodes;
first separating walls provided on an upper surface of the first shutter member; and
second separating walls provided on a lower surface of the shield member, which faces the upper surface of the first shutter member,
wherein the first shutter member is rotated about a rotation shaft to change the target to be used for film forming, such that the first separating walls are positioned close to respective ones of the second separating walls and first gaps in a circumferential direction of the rotation are formed between the first separating walls and the respective ones of the second separating walls, the first gaps being effective to prevent atoms from the targets passing through the first gaps, the first separating walls and the second separating walls extending radially about the rotation shaft, and
wherein a second gap between the upper surface of the first shutter member and the lower surface of the shield member widens toward an outer perimeter of the first shutter member from a portion where adjacent target electrodes are closest, and the second gap narrows toward a center of the first shutter member from the portion where the adjacent target electrodes are closest.

2. The film forming apparatus according to claim 1, wherein the shield member is disposed between the target electrodes and the first shutter member.

3. The film forming apparatus according to claim 2, wherein in the portion where adjacent target electrodes are closest, the shield member has a radius of curvature greater than that of the first shutter member.

4. The film forming apparatus according to claim 2, further comprising a second shutter member rotatably provided between the first shutter member and the substrate holder and having a number of openings greater than or equal to the number of the openings of the first shutter member,
wherein the openings of the second shutter member can be positioned so as to oppose the openings of the first shutter member.

5. The film forming apparatus according to claim 1,
wherein a sum of a height of the first separating walls at a position and a height of the second separating walls at the position is larger than the first gap between the first shutter member and the shield member at the position, and
wherein the first separating walls are provided so as to sandwich the opening of the first shutter member.

6. The film forming apparatus according to claim 5, wherein two of the target electrodes are used in simultaneous film formation processing, and
during the simultaneous film formation processing, the openings of the first shutter member simultaneously oppose the attachment surfaces of the target electrodes used in the simultaneous film formation processing.

7. The film forming apparatus according to claim 1, wherein two openings are formed in the first shutter member, and the two openings are formed in symmetric positions about the rotation shaft.

8. The film forming apparatus according to claim 5, wherein the openings formed in the first shutter member have a dimension that is longer in a circumferential direction than in a radial direction of the first shutter member.

9. A film forming apparatus comprising:
a plurality of target electrodes respectively having attachment surfaces to which targets can be attached;
a substrate holder for holding a substrate at a position opposing the plurality of target electrodes;
a first shutter member rotatably provided between the plurality of target electrodes and the substrate holder and having a plurality of openings that can oppose the attachment surfaces;
a shield member provided between the first shutter member and the plurality of target electrodes and having a number of openings equal to the number of the target electrodes;
first separating walls provided on an upper surface of the first shutter member; and
second separating walls provided on a lower surface of the shield member, which faces the upper surface of the first shutter member,
wherein the first shutter member is rotated about a rotation shaft to change the target to be used for film forming, such that the first separating walls are positioned close to respective ones of the second separating walls and first gaps in a circumferential direction of the rotation are formed between the first separating walls and the respective ones of the second separating walls, the first gaps being effective to prevent atoms from the targets passing through the first gaps, the first separating walls and the second separating walls extending radially about the rotation shaft, and
wherein a second gap between the upper surface of the first shutter member and the lower surface of the shield member widens toward an outer perimeter of the first shutter member from a portion where adjacent target electrodes are closest, and the second gap widens toward a center of the first shutter member from the portion where the adjacent target electrodes are closest.

10. A film forming apparatus comprising:
a plurality of target electrodes respectively having attachment surfaces to which targets can be attached;
a substrate holder for holding a substrate at a position opposing the plurality of target electrodes;

a first shutter member rotatably provided between the plurality of target electrodes and the substrate holder and having a plurality of openings that can oppose the attachment surfaces;

a shield member provided between the first shutter member and the plurality of target electrodes and having a number of openings equal to the number of the target electrodes, a lower surface of the shield member, around each of the plurality of openings and facing the first shutter member, having a continuously curved shape, first separating walls provided on an upper surface of the first shutter member; and second separating walls provided on the lower surface of the shield member, which faces the upper surface of the first shutter member, wherein the first shutter member is rotated about a rotation shaft to change the target to be used for film forming, such that the first separating walls are positioned close to respective ones of the second separating walls and first gaps in a circumferential direction of the rotation are formed between the first separating walls and the respective ones of the second separating walls, the first gaps being effective to prevent atoms from the targets passing through the first gaps, the first separating walls and the second separating walls extending radially about the rotation shaft, and wherein a second gap between the upper surface of the first shutter member and the lower surface of the shield member widens toward an outer perimeter of the first shutter member from a portion where the adjacent target electrodes are closest, and the second gap narrows toward a center of the first shutter member from the portion where adjacent target electrodes are closest.

11. The film forming apparatus according to claim 1, wherein the shield member constitutes a part of a spherical surface.

12. The film forming apparatus according to claim 11, wherein the first shutter member constitutes a part of a spherical surface, a radius of the spherical surface of the first shutter member being smaller than a radius of the spherical surface of the shield member.

13. The film forming apparatus according to claim 1, wherein the shield member has an upwardly bulged and curved shape.

14. The film forming apparatus according to claim 9, wherein the shield member has an upwardly bulged and curved shape.

15. The film forming apparatus according to claim 10, wherein the shield member constitutes a part of a spherical surface.

16. The film forming apparatus according to claim 10, wherein the shield member has an upwardly bulged and curved shape.

* * * * *